(12) United States Patent
Chen

(10) Patent No.: US 11,374,063 B2
(45) Date of Patent: Jun. 28, 2022

(54) DISPLAY PANEL WITH COLOR FILTER LAYER AND ANTI-REFLECTION FILM LAYER AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Zesheng Chen, Wuhan (CN)

(*) Notice: Subject to any disclaimer, the term of this patent is extended or adjusted under 35 U.S.C. 154(b) by 114 days.

(21) Appl. No.: 16/638,137

(22) PCT Filed: Dec. 31, 2019

(86) PCT No.: PCT/CN2019/130233
§ 371 (c)(1),
(2) Date: Feb. 11, 2020

(87) PCT Pub. No.: WO2021/120325
PCT Pub. Date: Jun. 24, 2021

(65) Prior Publication Data
US 2021/0193741 A1 Jun. 24, 2021

(30) Foreign Application Priority Data

Dec. 20, 2019 (CN) .......................... 201911321982.3

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3262* (2013.01); *H01L 51/5237* (2013.01); *H01L 51/56* (2013.01); *H01L 2251/558* (2013.01)

(58) Field of Classification Search
CPC .............. H01L 27/322; H01L 27/3262; H01L 51/5237; H01L 51/56; H01L 2251/558
(Continued)

(56) References Cited

U.S. PATENT DOCUMENTS

2003/0227021 A1* 12/2003 Yamazaki ........... H01L 51/5271
257/83
2011/0090438 A1* 4/2011 Lee ................... G02F 1/136209
349/110
(Continued)

FOREIGN PATENT DOCUMENTS

CN 104932145 A 9/2015
CN 107086221 A 8/2017
(Continued)

*Primary Examiner* — Xia L Cross

(57) ABSTRACT

The present invention provides a display panel and a manufacturing method of the display panel. The display panel includes a base substrate, a light emitting device layer, an encapsulation layer, and a color filter layer. The color filter layer includes multiple first light shielding portions, multiple color resists, and multiple second light shielding portions. An opening is formed between each two adjacent second light shielding portions and arranged corresponding to the pixel unit. The present invention increases an area for inkjet printing in a high-resolution small-sized display panel and reduces the reflectivity of the display panel to ambient light, and edges of the color filter layer less affect a light emitting device.

9 Claims, 6 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2015/0042935 | A1* | 2/2015 | Yamamoto | G02B 5/0294 |
| | | | | 349/112 |
| 2016/0056415 | A1* | 2/2016 | Yoo | H01L 51/5284 |
| | | | | 349/43 |
| 2017/0168223 | A1 | 6/2017 | Feng | |

FOREIGN PATENT DOCUMENTS

| | | | |
|---|---|---|---|
| CN | 109817676 A | 5/2019 | |
| CN | 110350003 A | 10/2019 | |
| CN | 110459581 A | 11/2019 | |
| CN | 110518151 A | 11/2019 | |

\* cited by examiner

DISPLAY PANEL WITH COLOR FILTER LAYER AND ANTI-REFLECTION FILM LAYER AND MANUFACTURING METHOD THEREOF

This application claims priority to Chinese patent application no. 201911321982.3, entitled "Display Panel and Manufacturing Method thereof", filed on Dec. 20, 2019, the entire contents of which are incorporated by reference in this application.

1. Field of Disclosure

The present invention relates to a field of display technology and in particular to a display panel and a manufacturing method thereof.

2. Description of Related Art

Polarizers (POL) can effectively reduce the reflectivity of display sub-panels under strong light, but lose nearly 58% of the light output. For OLED, it greatly limits its product lifespan. In addition, the polarizers are thick and brittle, which is not conducive to the development of flexible products.

At present, the technology that uses color filters to replace polarizers is categorized as POL-less technology in the industry. This technology is considered to be one of the key technologies for the development of flexible products. A functional layer is reduced from 100 μm to less than 5 μm, and the light output is improved from 42% to 60%. However, compared with large-sized display panels, small-size display panels with the same resolution has a smaller pixel size, so printing difficulty is higher. A resolution of printing is an important factor limiting the development of small-size printing technology. In terms of POL-less technology, it takes at least four photolithography processes, which brings great challenges to encapsulation requirement for light emitting devices of a display panel.

In summary, it is necessary to provide a new display panel and a manufacturing method thereof to solve the above technical problems.

SUMMARY

The invention provides a display panel and a manufacturing method thereof, which can solve a conventional technical problem that it is difficult to print a color filter layer for a small-sized high-resolution display panel.

Accordingly, the present invention provides solutions as follows.

The present invention provides a display panel, comprising:
a base substrate;
a thin film transistor (TFT) array layer disposed on the base substrate;
a light emitting device layer disposed on the TFT array layer, the light emitting device layer comprising a plurality of pixel units;
an encapsulation layer disposed on the light emitting device layer; and
a color filter layer disposed on the encapsulation layer, the color filter layer comprising a plurality of first light shielding portions, a plurality of color resists, and a plurality of second light shielding portions;
wherein the first light shielding portions are spaced apart from each other on the encapsulation layer, the color resist is disposed in an interval between two adjacent first light shielding portions, an orthographic projection of the second light shielding portion projected on the base substrate covers orthographic projections of the first light shielding portion and a periphery of the color resist projected on the base substrate, so that an opening is formed between each two adjacent second light shielding portions, the opening is arranged corresponding to the pixel unit, and the opening has an inverted trapezoidal shape.

In the display panel according to one embodiment of the present invention, a width of the second light shielding portion is greater than a width of the first light shielding portion.

In the display panel according to one embodiment of the present invention, the first light shielding portion and the second light shielding portion each are a composite structure constituted by multiple stacked film layers.

In the display panel according to one embodiment of the present invention, the composite structure comprises a silicon oxide layer, a silicon nitride layer, and a silicon oxide layer which are sequentially stacked from bottom to top.

In the display panel according to one embodiment of the present invention, the display panel further comprises an anti-reflection film layer, and the anti-reflection film layer covers the second light shielding portion and the opening.

In the display panel according to one embodiment of the present invention, a shape of each of the openings is the same as a shape of a corresponding one of the pixel units, and an orthographic projection of each opening and an orthographic projection of a corresponding one of the pixel units coincide with each other on the base substrate.

In the display panel according to one embodiment of the present invention, a width of the opening is less than a width of the color resist.

In the display panel according to one embodiment of the present invention, a thickness of the second light shielding portion ranges from 0.1 nm to 1000 nm.

The present invention provides a display panel, comprising:
a base substrate;
a thin film transistor (TFT) array layer disposed on the base substrate;
a light emitting device layer disposed on the TFT array layer, the light emitting device layer comprising a plurality of pixel units;
an encapsulation layer disposed on the light emitting device layer; and
a color filter layer disposed on the encapsulation layer, the color filter layer comprising a plurality of first light shielding portions, a plurality of color resists, and a plurality of second light shielding portions;
wherein the first light shielding portions are spaced apart from each other on the encapsulation layer, the color resist is disposed in an interval between each two adjacent first light shielding portions, an orthographic projection of the second light shielding portion projected on the base substrate covers orthographic projections of the first light shielding portion and a periphery of the color resist projected on the base substrate, so that an opening is formed between each two adjacent second light shielding portions, and the opening is arranged corresponding to the pixel unit.

In the display panel according to one embodiment of the present invention, a width of the second light shielding portion is greater than a width of the first light shielding portion.

In the display panel according to one embodiment of the present invention, the first light shielding portion and the second light shielding portion each are a composite structure constituted by multiple stacked film layers.

In the display panel according to one embodiment of the present invention, the display panel further comprises an anti-reflection film layer, and the anti-reflection film layer covers the second light shielding portion and the opening.

In the display panel according to one embodiment of the present invention, a shape of each of the openings is the same as a shape of a corresponding one of the pixel units, and an orthographic projection of each opening and an orthographic projection of a corresponding one of the pixel units coincide with each other on the base substrate.

The present invention provides a manufacturing method of a display panel, comprising following steps:

step S10: providing a base substrate, and sequentially forming a thin film transistor (TFT) array layer, a light emitting device layer, and an encapsulation layer on the base substrate; and step S20: forming a color filter layer on the encapsulation layer, wherein the color filter layer comprises a plurality of first light shielding portions, a plurality of color resists, and a plurality of second light shielding portions, the first light shielding portions are spaced apart from each other on the encapsulation layer, the color resist is formed in an interval between each two adjacent first light shielding portions, an orthographic projection of the second light shielding portion projected on the base substrate covers orthographic projections of the first light shielding portion and a periphery of the color resist projected on the base substrate, so that an opening is formed between each two adjacent second light shielding portions, and the opening is arranged corresponding to the pixel unit.

In the manufacturing method of the display panel according to one embodiment of the present invention, the step S20 comprising following steps:

step S201: forming the first light shielding portions on the encapsulation layer through a first photolithography process;

step S202: inkjet printing to form the color resist in the interval between each two adjacent first light shielding portions; and step S203: forming the second light shielding portions on the first light shielding portions and the color resists through a second photolithography process, wherein the opening is formed between each two adjacent second light shielding portions.

The manufacturing method of the display panel according to one embodiment of the present invention further comprises step S30: forming an anti-reflection film layer on the second light shielding portion and in the opening, wherein the anti-reflection film layer covers the second light shielding portion and the opening.

In the manufacturing method of the display panel according to one embodiment of the present invention, a width of the second light shielding portion is greater than a width of the first light shielding portion.

In the manufacturing method of the display panel according to one embodiment of the present invention, the first light shielding portion and the second light shielding portion each are a composite structure constituted by multiple stacked film layers.

In the manufacturing method of the display panel according to one embodiment of the present invention, the composite structure comprises a silicon oxide layer, a silicon nitride layer, and a silicon oxide layer that are sequentially stacked from bottom to top.

In the manufacturing method of the display panel according to one embodiment of the present invention, a thickness of the second light shielding portion ranges from 0.1 nm to 1000 nm.

Advantages of the present invention:

The present invention provides a display panel and a manufacturing method thereof. A first light shielding portion and a second light shielding portion with different widths are utilized, and combined with a color resist layer, constitute a color filter layer. Such configuration increases an area for inkjet printing in a high-resolution small-sized display panel, and the printing difficulty is reduced. At the same time, the reflectivity of the display panel to external ambient light is lowered, and edges of the color filter layer less affect the optical characteristics of the light emitting device. Compared with conventional techniques, at least two photolithography processes are avoided, and the encapsulation performance is improved.

BRIEF DESCRIPTION OF DRAWINGS

In order to more clearly illustrate the embodiments of the present disclosure or related art, figures which will be described in the embodiments are briefly introduced hereinafter. It is obvious that the figures are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
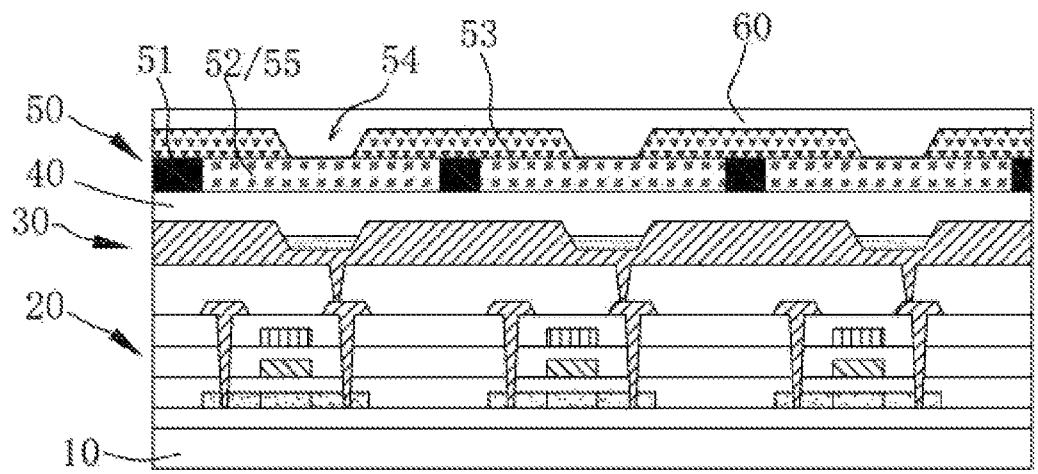
FIG. 1 is a schematic cross-sectional view illustrating a structure of a display panel according to one embodiment of the present invention.

The following descriptions of the embodiments are made with reference to additional illustrations to illustrate specific embodiments in which the present invention can be implemented. The directional terms mentioned in the present invention, such as "up", "down", "front", "rear", "left", "right", "inner", "outer", and "lateral", are for illustration based on the accompanying drawings. Therefore, the directional terms used are for explaining and understanding the present invention, but not for limiting the present invention. In the drawings, structurally similar units are denoted by the same reference numerals.

The present invention aims to solve a conventional technical problem that it is difficult to print a color filter layer for a small-sized high-resolution display panel, and the present embodiment can solve this problem.

Referring to FIG. 1, the present invention provides a display panel. The display panel comprises a base substrate 10, a thin film transistor (TFT) array layer 20 disposed on the base substrate 10, a light emitting device layer 30 disposed on the TFT array layer 20, an encapsulation layer 40 disposed on the light emitting device layer 30, and a color filter layer 50 disposed on the encapsulation layer 40.

Figure 2:
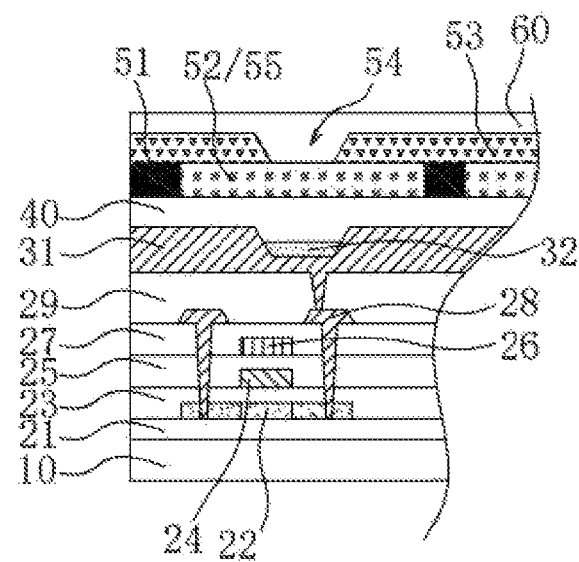
FIG. 2 is a schematic view illustrating a portion of the structure of the display panel of FIG. 1.

Specifically, as shown in FIG. 2, the TFT array layer 20 includes a buffer layer 21, a semiconductor layer 22, a first gate insulating layer 23, and a second gate insulating layer 25, an interlayer dielectric layer 27, and a planarization layer 29 which are sequentially stacked on the base substrate 10. A first gate metal layer 24 is disposed on the first gate insulating layer 23, a second gate metal layer 26 is disposed on the second gate insulating layer 25, and a source/drain metal layer 28 is disposed on the interlayer dielectric layer 27.

In the present invention, the light emitting device layer 30 comprises a pixel definition layer 31 and a plurality of pixel units 32 disposed on the planarization layer 29. The pixel unit 32 can be an organic light emitting diode device. The pixel units 32 can be red, green, and blue pixel units. An anode of the light emitting device layer 30 is in contact with the source/drain metal layer 28.

The encapsulation layer 40 can be made by thin-film encapsulation technology. The encapsulation layer 40 is formed by sequentially stacking an inorganic layer, an organic layer, and an inorganic layer to enhance the encapsulation performance of the display panel.

As shown in FIGS. 1 and 2, the color filter layer 50 comprises a plurality of first light shielding portions 51, a plurality of color resists 52, and a plurality of second light shielding portions 53. The first light shielding portions 51 are spaced apart from each other on the encapsulation layer 40, the color resist 52 is disposed in an interval between two adjacent first light shielding portions 51, an orthographic projection of the second light shielding portion 53 projected on the base substrate 10 covers orthographic projections of the first light shielding portion 51 and a periphery of the color resist 52 projected on the base substrate 10, so that an opening 54 is formed between each two adjacent second light shielding portions 53. The opening 54 is arranged corresponding to the pixel unit 32.

The color resists 52 are red, green, and blue color resists. The red color resist, the green color resist, and the blue color resist are respectively disposed corresponding to the red pixel unit, the green pixel unit, and the blue pixel unit. It can be understood that, the opening 54 on the red color resist is arranged corresponding to the red pixel unit, the opening 54 on the green color resist is arranged corresponding to the green pixel unit, and the opening 54 on the blue color resist is arranged corresponding to the blue pixel unit.

According to one embodiment of the present invention, a width of the second light shielding portion 53 is greater than a width of the first light shielding portion 51. On the one hand, the second light shielding portion 53 can reduce the reflectivity of the display panel to external ambient light. On the other hand, the second light shielding portion 53 can cover the periphery of the color resist 52. Accordingly, a horn-like structure around the color resist 52 caused by an overlap of the color resist 52 and the first light shielding portion 51 can be avoided, and the flatness of the color resist 52 in the opening 54 can be improved.

In addition, a width of the opening 54 is less than a width of the color resist, and light is emitted through the opening 54, so printing requirements for a small-sized high-resolution display panel can be satisfied, and a tolerance for precise printing is improved. A shape of each opening 54 is the same as a shape of the corresponding pixel unit 32. An orthographic projection of each opening 54 and an orthographic projection of the corresponding pixel unit 32 coincide with each other on the base substrate. According to one embodiment of the present invention, a cross-section of the opening 54 has an inverted trapezoidal shape.

The first light shielding portion 51 is equivalent to a bank for forming the color resist 52, so a thickness of the first light shielding portion 51 depends on a thickness of the color resist 52. In order to reduce the reflectivity of the display panel to external ambient light, so a thickness of the second light shielding portion 53 should satisfy an optical density value (OD) greater than 3. Specifically, the thickness of the second light shielding portion 53 is nanoscale. For example, the thickness of the second light shielding portion 53 ranges from 0.1 nm to 1000 nm.

In detail, the first light shielding portion 51 and the second light shielding portion 53 can be made of a black matrix; however, the present invention is not limited in this regard. The first light shielding portion 51 and the second light shielding portion 53 can also be made of a single-layer low-reflectivity material or a composite multilayer low-reflectivity film material or other anti-reflection material. For example, the first light shielding portion 51 and the second light shielding portion 53 each are a composite structure constituted by multiple stacked low-reflectivity films. The composite structure comprises a silicon oxide layer, a silicon nitride layer, and a silicon oxide layer stacked in order from bottom to top. The anti-reflection performance of the first light shielding portion 51 and the second light shielding portion 53 can be enhanced by using the composite structure, thereby improving a contrast ratio.

Further, in order to further reduce the reflectivity of the display panel to external ambient light, the display panel further comprises an anti-reflection film layer 60 that covers the second light shielding portion 53 and the opening 54.

Figure 3:
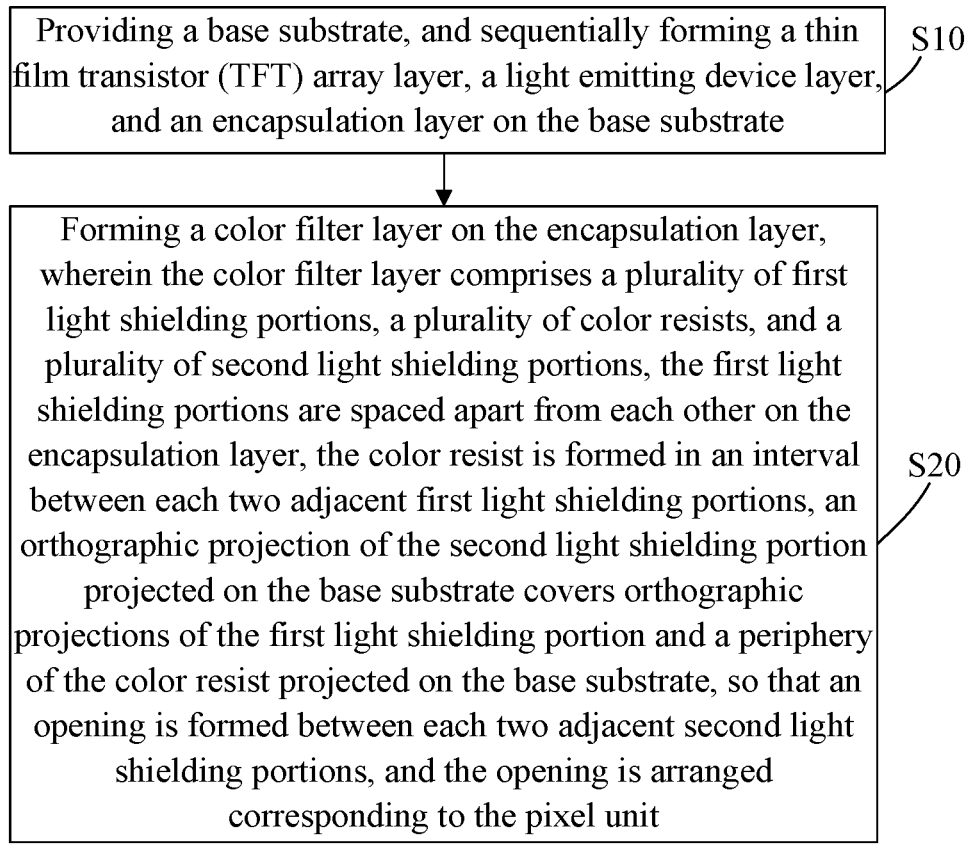
FIG. 3 is a process flow diagram illustrating a manufacturing method of the display panel according to one embodiment of the present invention.

Referring to FIG. 3, the present invention further provides a manufacturing method of a display panel, comprising following steps:

step S10: providing a base substrate 10, and sequentially forming a thin film transistor (TFT) array layer 20, a light emitting device layer 30, and an encapsulation layer 40 on the base substrate 10.

Figure 4:
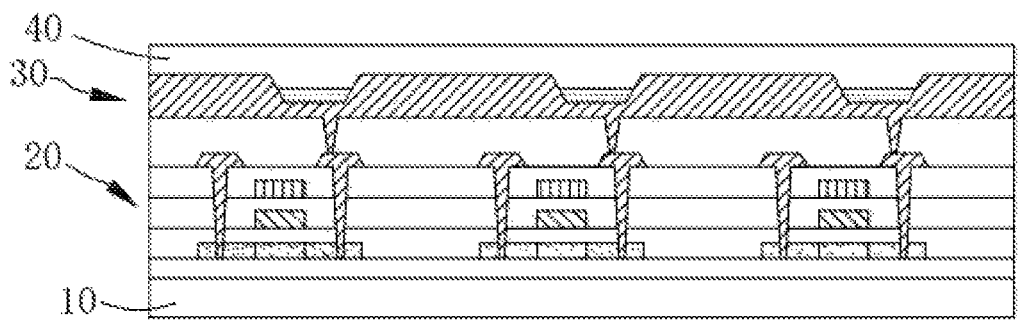
FIG. 4 is a schematic view illustrating step S10 in the manufacturing method of the display panel according to one embodiment of the present invention.

In detail, as shown in FIG. 4, the TFT array layer 20 is formed on the base substrate 10, the light emitting device layer 30 is formed on the TFT array layer 20, and the encapsulation layer 40 is formed on the light emitting device layer 30.

step S20: forming a color filter layer 50 on the encapsulation layer 40, wherein the color filter layer 50 comprises a plurality of first light shielding portions 51, a plurality of color resists 52, and a plurality of second light shielding portions 53, the first light shielding portions 51 are spaced apart from each other on the encapsulation layer 40, the color resist 52 is formed in an interval 55 between each two adjacent first light shielding portions 51, an orthographic projection of the second light shielding portion 53 projected on the base substrate 10 covers orthographic projections of the first light shielding portion 51 and a periphery of the color resist 52 projected on the base substrate 10, so that an opening 54 is formed between each two adjacent second light shielding portions 53, and the opening 54 is arranged corresponding to the pixel unit 32.

Figure 5:
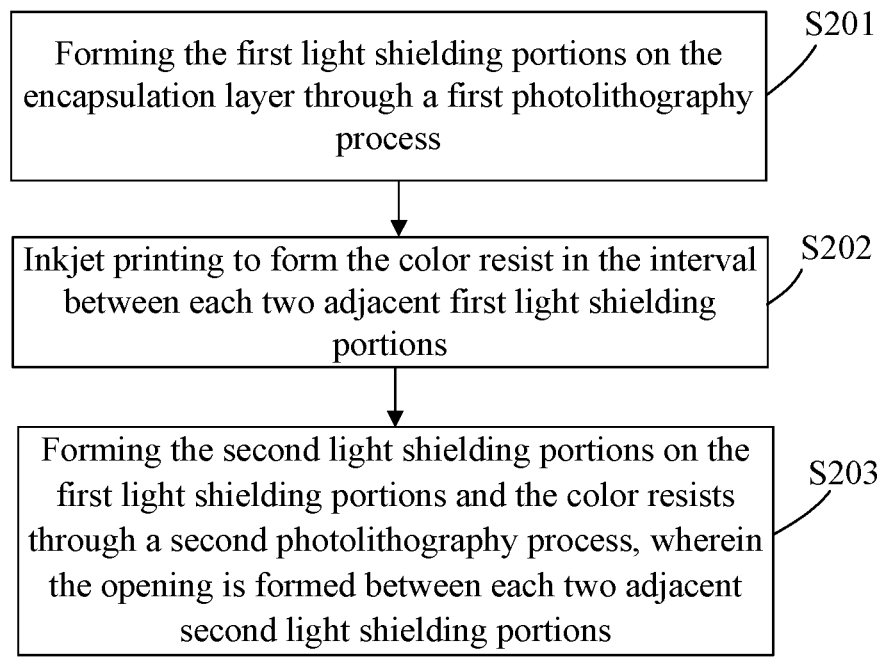
FIG. 5 is a process flow diagram illustrating forming a color filter layer in step S20 according to one embodiment of the present invention.

In detail, as shown in FIG. 5, step S20 comprises following steps:

step S201: forming the first light shielding portions 51 on the encapsulation layer 40 through a first photolithography process.

Figure 6:
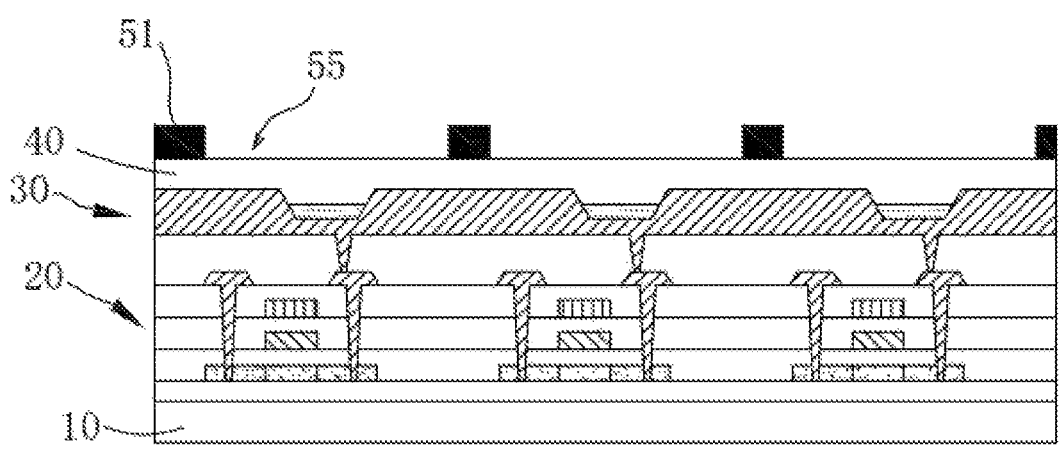
FIG. 6 is a cross-sectional view illustrating the display panel with first light shielding portions formed in step S201 according to one embodiment of the present invention.
Figure 7:
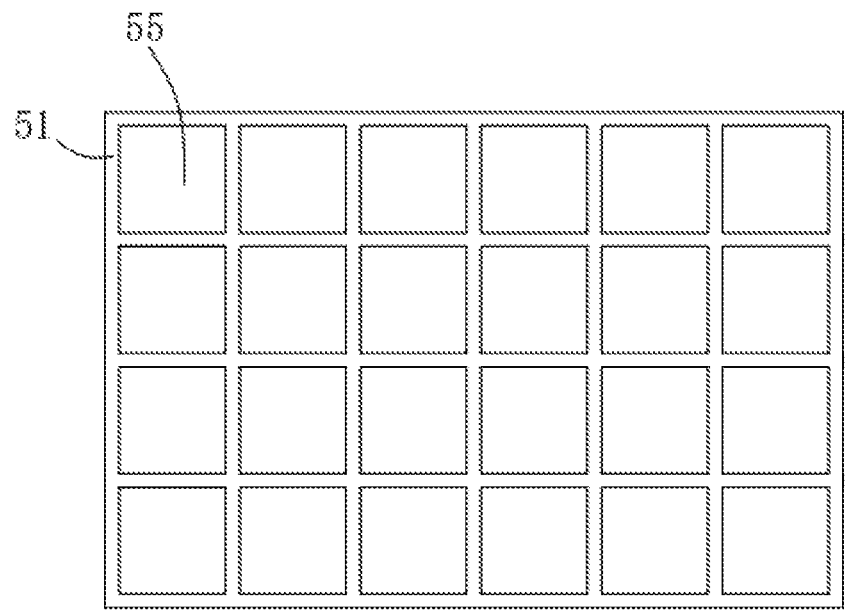
FIG. 7 is a top view illustrating the display panel with the first light shielding portions formed in step S201 according to one embodiment of the present invention.

As shown in FIG. 6, the first photolithography process includes a photoresist coating step, an exposure step, and a developing step performed sequentially, and the first light shielding portions 51 spaced apart from each other are formed on the encapsulation layer 40. FIG. 7 is a top view illustrating the display panel with the first light shielding portions 51 formed therein. The first light shielding portions 51 encloses a grid pattern.

step S202: inkjet printing to form the color resist 52 in the interval 55 between each two adjacent first light shielding portions 51.

Figure 8:
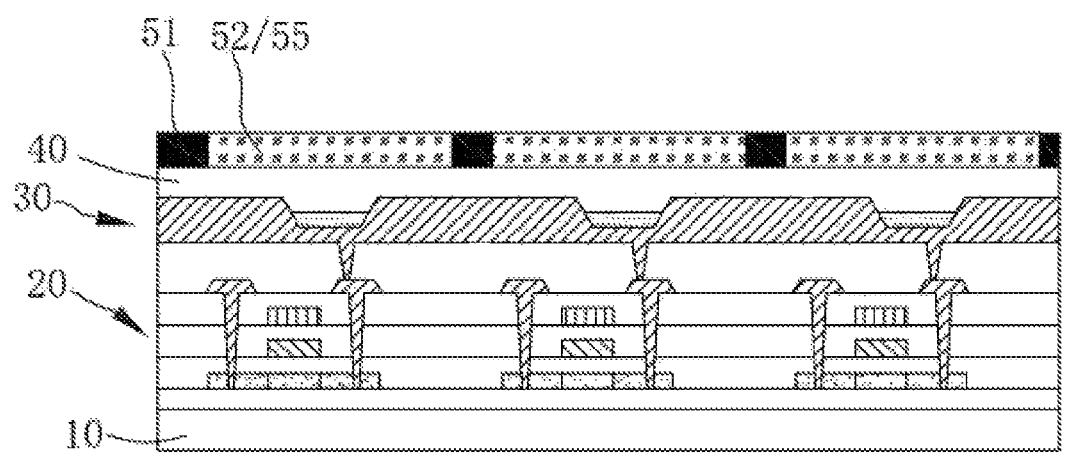
FIG. 8 is a cross-sectional view illustrating the display panel with color resists formed in step S202 according to one embodiment of the present invention.
Figure 9:
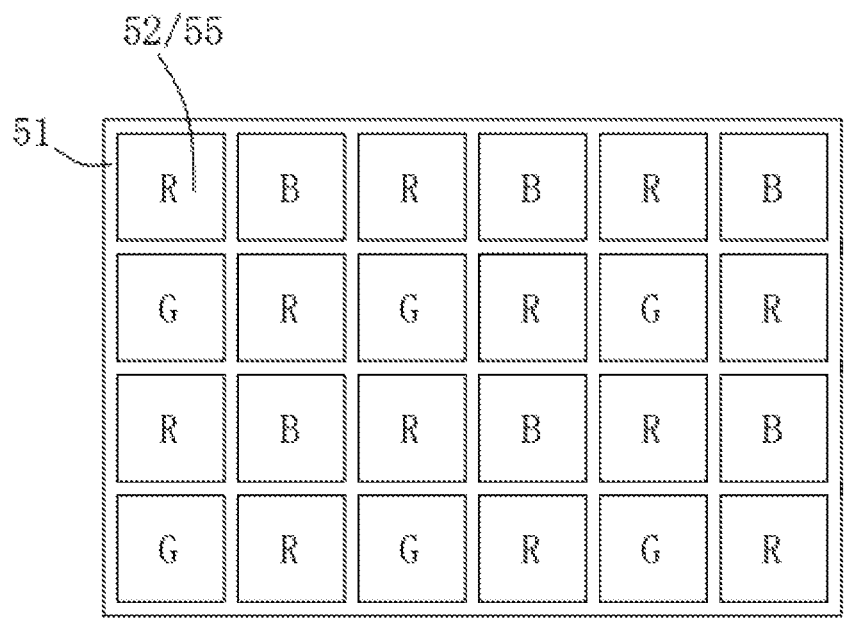
FIG. 9 is a top view illustrating the display panel with the color resists formed in step S202 according to one embodiment of the present invention.

As shown in FIG. 8, the first light shielding portion 51 is used as a bank for forming the color resist 52, and inkjet printing technology is used to inject a color filter solution and cure it to form the color resist 52 between two adjacent first light shielding portions 51 in FIG. 7. The first light shielding portion 51, the color resist 52, and the second light shielding portion 53 together constitute the color filter layer 50. FIG. 9 is a top view of the display panel with the first light shielding portions 51. The color resists 52 includes red, green, and blue color resists.

Because the width of the first light shielding portion 51 is narrower, a space reserved for forming the color resist 52 is relatively large. For a small-sized display panel, the tolerance of precise printing is improved, and it is easier to print the color filter layer in a small-sized high-resolution display panel, thus increasing an area for inkjet printing in a high-resolution small-sized display panel.

step S203: forming the second light shielding portions 53 on the first light shielding portions 51 and the color resists 52 through a second photolithography process, wherein the opening 54 is formed between each two adjacent second light shielding portions 53.

Figure 10:
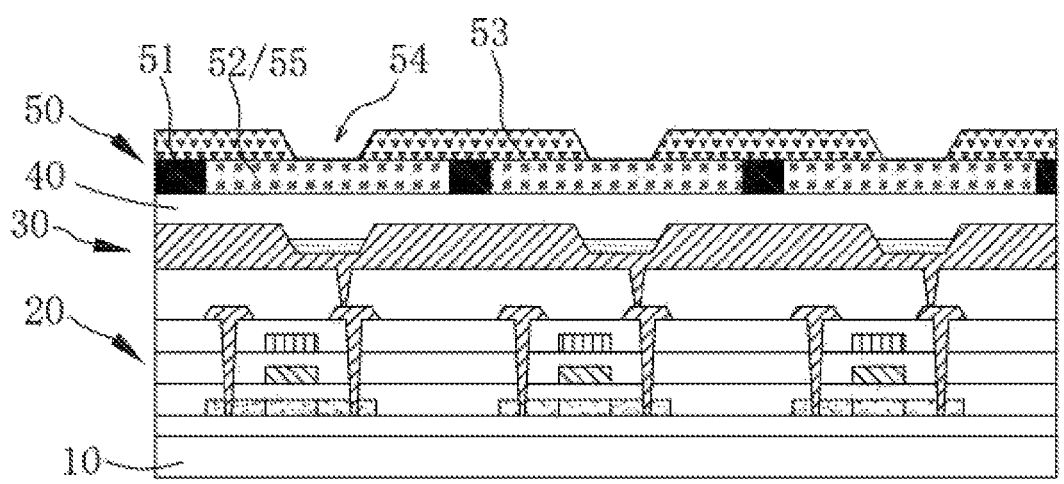
FIG. 10 is a cross-sectional view illustrating the display panel with second light shielding portions formed in step S203 according to one embodiment of the present invention.
Figure 11:
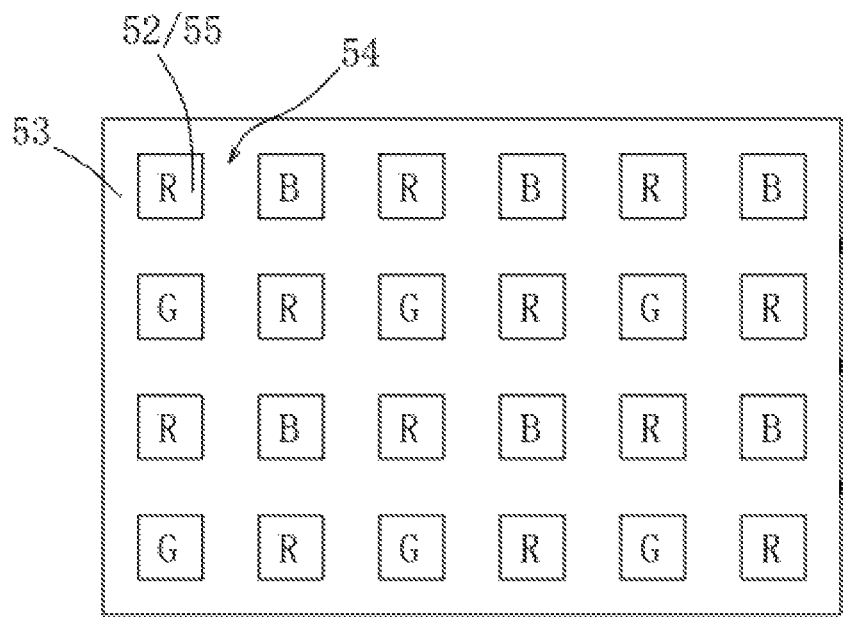
FIG. 11 is a top view illustrating the display panel with the second light shielding portions formed in step S203 according to one embodiment of the present invention.

As shown in FIG. 10, the second photolithography process includes a photoresist coating step, an exposure step, and a developing step performed in sequence to form the second light shielding portion 53 on the first light shielding portion 51 and the color resist 52. The opening 54 is formed between two adjacent second light shielding portions 53. FIG. 11 is a top view illustrating the display panel with the second light shielding portions 53. The width of the second light shielding portion 53 is greater than the width of the first light shielding portion 51, so that an area of the color resist 52 not covered by the second light shielding portion 53 is smaller than that in step S202.

Generally, after the color resist 52 is cured in step S202, a surface of the color resist 52 is not flat and even, but instead is flat in the middle and has a horn-like structure around a middle portion. In the present embodiment, the second light shielding portion 53 covers the periphery of the color resist 52 to shield the horn-like structure, so that the periphery of the color resist 52 less affects the light output characteristics of a light emitting device, and the flatness of the color resist 52 corresponding to the opening 54 is improved. In addition, the wider width of the second light shielding portion 53 also lowers reflectivity of the display panel to external ambient light and thus improves a contrast ratio.

The first light shielding portion 51 and the second light shielding portion 53 can be made of a black matrix (BM); however, the present invention is not limited in this regard. The first light shielding portion 51 and the second light shielding portion 53 can also be made of a single-layer low-reflectivity material or a composite multilayer low-reflectivity film material or other anti-reflection material. For example, the first light shielding portion 51 and the second light shielding portion 53 each are a composite structure constituted by multiple stacked low-reflectivity films. The composite structure comprises a silicon oxide layer, a silicon nitride layer, and a silicon oxide layer stacked in order from bottom to top. The anti-reflection performance of the first light shielding portion 51 and the second light shielding portion 53 can be enhanced by using the composite structure, thereby improving a contrast ratio.

Figure 12:
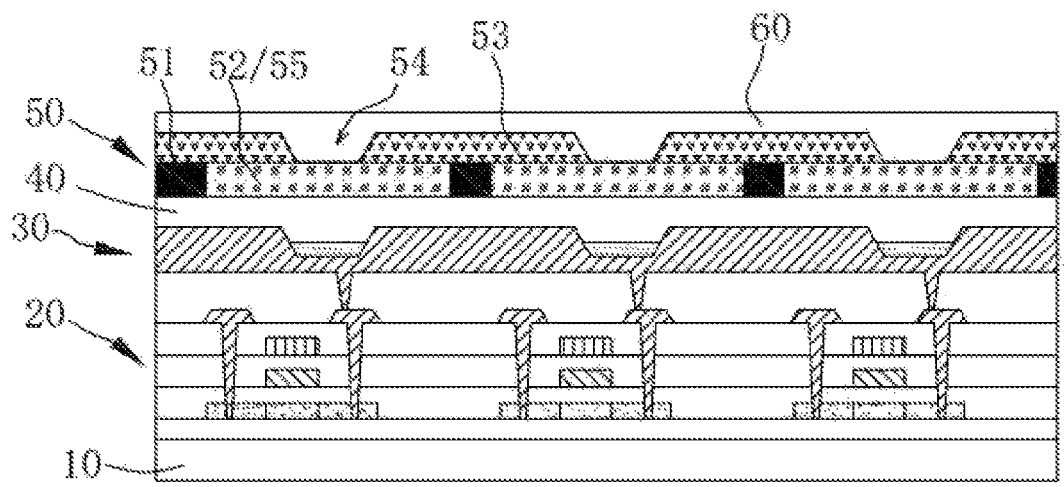
FIG. 12 is a schematic view illustrating step S30 in the manufacturing method of the display panel according to one embodiment of the present invention.

Furthermore, as shown in FIG. 12, in order to further lower the reflectivity of the display panel to external ambient light, the manufacturing method of display panel further comprises step S30: forming an anti-reflection film layer 60 on the second light shielding portion 53 and in the opening 54, wherein the anti-reflection film layer 60 covers the second light shielding portion 53 and the opening 54.

In the manufacturing method of the display panel according to the present invention, only two photolithography processes are required to form the color filter layer 50. Compared with conventional techniques, at least two photolithography processes are skipped, thereby avoiding encapsulation problem resulting from too many photolithography processes.

Advantages of the present invention:

The present invention provides a display panel and a manufacturing method thereof. A first light shielding portion and a second light shielding portion with different widths are utilized, and combined with a color resist layer, constitute a color filter layer. Such configuration increases an area for inkjet printing in a high-resolution small-sized display panel, and the printing difficulty is reduced. At the same time, the reflectivity of the display panel to external ambient light is lowered, and edges of the color filter layer less affect the optical characteristics of the light emitting device. Compared with conventional techniques, at least two photolithography processes are avoided, and the encapsulation performance is improved.

In summary, although the present invention has been disclosed as above with preferable embodiments, the above embodiments are not intended to limit the present invention. Those skilled in the art can make various modifications without departing from the spirit and scope of the present invention Therefore, the protection scope of the present invention should be defined by the appended claims.

What is claimed is:

1. A display panel, comprising:
    a base substrate;
    a thin film transistor (TFT) array layer disposed on the base substrate;
    a light emitting device layer disposed on the TFT array layer, the light emitting device layer comprising a plurality of pixel units;
    an encapsulation layer disposed on the light emitting device layer;

a color filter layer disposed on the encapsulation layer, the color filter layer comprising a plurality of first light shielding portions, a plurality of color resists, and a plurality of second light shielding portions; and an anti-reflection film layer;

wherein the first light shielding portions are spaced apart from each other on the encapsulation layer, each color resist is disposed in an interval between two adjacent first light shielding portions, an orthographic projection of each second light shielding portion projected on the base substrate covers orthographic projections of the corresponding first light shielding portion and a periphery of the corresponding color resist projected on the base substrate, so that an opening is formed between each two adjacent second light shielding portions, each opening is arranged corresponding to one of the pixel units, and each opening has an inverted trapezoidal shape;

wherein a width of each second light shielding portion is greater than a width of the corresponding first light shielding portion; and wherein the anti-reflection film layer covers the second light shielding portions and the openings.

2. The display panel according to claim 1, wherein the first light shielding portions and the second light shielding portions each are a composite structure constituted by multiple stacked film layers.

3. The display panel according to claim 2, wherein the composite structure comprises a silicon oxide layer, a silicon nitride layer, and a silicon oxide layer which are sequentially stacked from bottom to top.

4. The display panel according to claim 1, wherein a shape of each of the openings is the same as a shape of a corresponding one of the pixel units, and an orthographic projection of each opening and an orthographic projection of a corresponding one of the pixel units coincide with each other on the base substrate.

5. The display panel according to claim 1, wherein a width of each opening is less than a width of the corresponding color resist.

6. The display panel according to claim 1, wherein a thickness of each second light shielding portion ranges from 0.1 nm to 1000 nm.

7. A display panel, comprising:

a base substrate;

a thin film transistor (TFT) array layer disposed on the base substrate;

a light emitting device layer disposed on the TFT array layer, the light emitting device layer comprising a plurality of pixel units;

an encapsulation layer disposed on the light emitting device layer;

a color filter layer disposed on the encapsulation layer, the color filter layer comprising a plurality of first light shielding portions, a plurality of color resists, and a plurality of second light shielding portions; and an anti-reflection film layer;

wherein the first light shielding portions are spaced apart from each other on the encapsulation layer, each color resist is disposed in an interval between two adjacent first light shielding portions, an orthographic projection of each second light shielding portion projected on the base substrate covers orthographic projections of the corresponding first light shielding portion and a periphery of the corresponding color resist projected on the base substrate, so that an opening is formed between each two adjacent second light shielding portions, and each opening is arranged corresponding to one of the pixel units;

wherein a width of each second light shielding portion is greater than a width of the corresponding first light shielding portion; and wherein the anti-reflection film layer covers the second light shielding portions and the openings.

8. The display panel according to claim 7, wherein the first light shielding portions and the second light shielding portions each are a composite structure constituted by multiple stacked film layers.

9. The display panel according to claim 7, wherein a shape of each of the openings is the same as a shape of a corresponding one of the pixel units, and an orthographic projection of each opening and an orthographic projection of a corresponding one of the pixel units coincide with each other on the base substrate.

* * * * *